(12) United States Patent
Gardner

(10) Patent No.: US 11,127,595 B2
(45) Date of Patent: Sep. 21, 2021

(54) METHOD FOR BONDING A SEMICONDUCTOR SUBSTRATE TO A CARRIER

(71) Applicant: Microsoft Technology Licensing, LLC, Redmond, WA (US)

(72) Inventor: Geoffrey C. Gardner, West Lafeyette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/576,451

(22) Filed: Sep. 19, 2019

(65) Prior Publication Data

US 2021/0090891 A1     Mar. 25, 2021

(51) Int. Cl.
 *H01L 21/20* (2006.01)
 *H01L 23/532* (2006.01)
 *H01L 21/50* (2006.01)
 *H01L 23/00* (2006.01)
 *H01L 51/00* (2006.01)

(52) U.S. Cl.
 CPC .......... *H01L 21/2007* (2013.01); *H01L 21/50* (2013.01); *H01L 23/53266* (2013.01); *H01L 24/26* (2013.01); *H01L 24/27* (2013.01); *H01L 24/98* (2013.01); *H01L 51/0024* (2013.01)

(58) Field of Classification Search
 CPC ..... H01L 24/26; H01L 24/27; H01L 51/0024; H01L 24/98; H01L 21/2007; H01L 21/50; H01L 23/53266
 USPC ........................................................ 257/751
 See application file for complete search history.

(56) References Cited

U.S. PATENT DOCUMENTS

| 9,111,983 | B1* | 8/2015 | Ginter ................... B32B 43/006 |
| 2003/0089950 | A1 | 5/2003 | Kuech et al. |
| 2009/0026473 | A1 | 1/2009 | Jiang et al. |
| 2009/0278233 | A1* | 11/2009 | Pinnington ....... H01L 21/02389 257/615 |
| 2012/0080697 | A1 | 4/2012 | Chen et al. |
| 2013/0119401 | A1* | 5/2013 | D'Evelyn ............... C30B 19/12 257/76 |
| 2013/0188324 | A1* | 7/2013 | Lee ..................... H01L 27/1218 361/750 |

(Continued)

OTHER PUBLICATIONS

"International Search Report and Written Opinion Issued in PCT Application No. PCT/US2020/037960", dated Sep. 7, 2020, 32 Pages.

*Primary Examiner* — David Vu
*Assistant Examiner* — Brandon C Fox
(74) *Attorney, Agent, or Firm* — Withrow & Terranova, PLLC

(57) ABSTRACT

A method for fabricating a semiconductor device includes providing a semiconductor substrate and bonding the semiconductor substrate to a carrier. The semiconductor substrate includes an inert material layer and a semiconductor layer on the inert material layer. The semiconductor substrate is bonded to the carrier such that the inert material layer is between the carrier and the semiconductor substrate. By including an inert material layer between the carrier and the semiconductor substrate, a barrier against diffusion for any bonding agents used to bond the semiconductor substrate to the carrier is formed, thereby preserving the integrity of the semiconductor layer and allowing for the easy removal of the semiconductor substrate from the carrier.

19 Claims, 9 Drawing Sheets

(56) References Cited

U.S. PATENT DOCUMENTS

| | | | |
|---|---|---|---|
| 2014/0144593 A1* | 5/2014 | Dang | H01L 21/67092 |
| | | | 156/712 |
| 2015/0035554 A1* | 2/2015 | Dang | G01R 31/2607 |
| | | | 324/756.01 |
| 2016/0064265 A1 | 3/2016 | Nakamura | |
| 2017/0056994 A1* | 3/2017 | Joslin | B23K 35/24 |
| 2017/0110314 A1 | 4/2017 | Odnoblyudov et al. | |
| 2017/0125268 A1 | 5/2017 | Dang et al. | |
| 2017/0125453 A1* | 5/2017 | Hayk | H01L 27/3244 |

* cited by examiner

HEAT

METHOD FOR BONDING A SEMICONDUCTOR SUBSTRATE TO A CARRIER

FIELD OF THE DISCLOSURE

The present disclosure is related to semiconductor device fabrication, and in particular to improved methods for bonding a semiconductor substrate to a carrier for fabrication of semiconductor devices.

BACKGROUND

Semiconductor devices are formed by a wide variety of fabrication processes. Advanced semiconductor devices such as those used for quantum computing applications may require advanced manufacturing processes, for example, in-situ fabrication such as molecular beam epitaxy. In advanced manufacturing processes, a semiconductor substrate is often bonded to a carrier for support and stability during the manufacturing process. The bond between the semiconductor substrate and the carrier must be strong, but also allow for easy removal of the semiconductor substrate from the carrier after the manufacturing processes are complete.

SUMMARY

In one example, a method for fabricating a semiconductor device includes providing a semiconductor substrate and bonding the semiconductor substrate to a carrier. The semiconductor substrate includes an inert material layer and a semiconductor layer on the inert material layer. The semiconductor substrate is bonded to the carrier such that the inert material layer is between the carrier and the semiconductor substrate. By including an inert material layer between the carrier and the semiconductor substrate, a barrier against diffusion for any bonding agents used to bond the semiconductor substrate to the carrier is formed, thereby preserving the integrity of the semiconductor layer and allowing for the easy removal of the semiconductor substrate from the carrier.

In an additional example, the inert material layer is directly on the semiconductor layer.

In an additional example, after bonding the semiconductor substrate to the carrier, one or more devices are fabricated on the semiconductor substrate. The one or more devices may be fabricated via a molecular beam epitaxy process.

In an additional example, after fabricating the one or more devices on the semiconductor substrate, the semiconductor substrate is removed from the carrier.

In an additional example, bonding the semiconductor substrate to the carrier includes providing a bonding agent between the carrier and the semiconductor substrate and melting the bonding agent to bond the semiconductor substrate to the carrier. Removing the semiconductor substrate from the carrier may include heating the bonding agent and lifting the semiconductor substrate off of the carrier.

In an additional example, the bonding agent is a metal. The inert material layer may prevent diffusion of the bonding agent into the semiconductor layer. The bonding agent may have a melting point that is less than a melting point of the inert material layer and the carrier. Further, the bonding agent may have a melting point that is less than a melting point of the semiconductor layer. The inert material layer may comprise titanium, tungsten, or the like. The semiconductor layer may comprise Gallium Arsenide (GaAs), Indium Phosphide (InP), or the like. The bonding agent may comprise gallium or indium or the like. The carrier may comprise tantalum, molybdenum, or the like.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
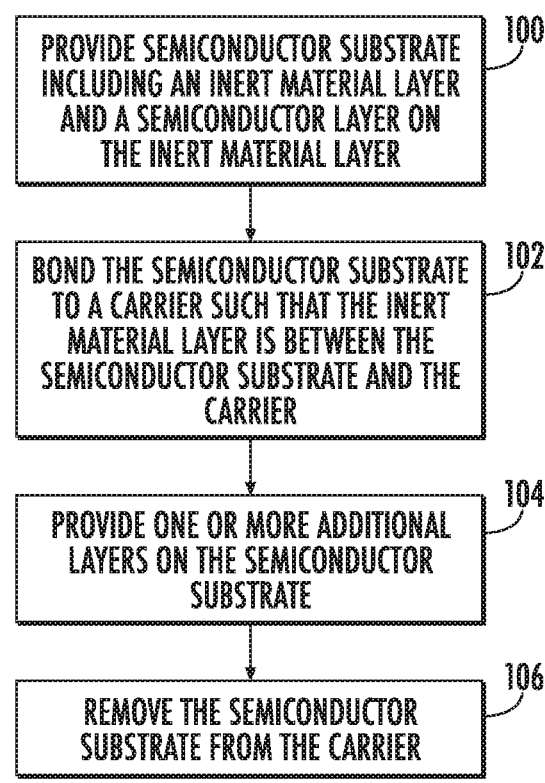
FIG. 1 is a flow diagram illustrating a method for fabricating one or more semiconductor devices according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As discussed above, there is a need to securely bond a semiconductor substrate to a carrier so that the semiconductor substrate can be supported and stabilized during certain semiconductor fabrication processes. One way to bond a semiconductor substrate to a carrier is with a metal bonding agent. Generally, it is desirable to use a metal with a low melting temperature for the metal bonding agent, such as gallium. However, such low melting temperature metals may react with the semiconductor substrate when used as a bonding agent. For example, when the semiconductor substrate includes indium and gallium is used as a metal bonding agent between the semiconductor substrate and a carrier, the gallium bonding agent will diffuse into the indium semiconductor substrate. The resulting indium-gallium compound formed at the interface of the carrier may make removal of the semiconductor substrate difficult, if not impossible. Further, the diffusion of the gallium bonding agent into the indium semiconductor substrate may interfere with the operation of one or more semiconductor devices formed on the semiconductor substrate.

As another example, when the semiconductor substrate includes indium and indium is also used as a metal bonding agent between the semiconductor substrate and a carrier, removal of the semiconductor substrate is difficult due to the fact that heating the indium metal bonding agent during a bonding and removal process will damage the indium semiconductor substrate, which has a similar melting point as the bonding agent. While non-metal bonding agents may be used, these non-metal bonding agents will generally not provide the same support and stability (e.g., temperature stability, growth process stability, and structural stability) as a metal bonding agent. Further, while clips or other attaching mechanisms could be used, these mechanisms will also not provide the same performance of a metal bonding agent.

Figure 2A:
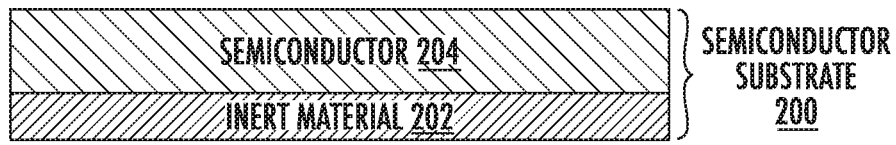
FIGS. 2A through 2D illustrate the method for fabricating one or more semiconductor devices of FIG. 1 according to one embodiment of the present disclosure.

In an effort to solve the problems mentioned above, FIG. 1 is a flow diagram illustrating a method for manufacturing a semiconductor device according to one embodiment of the present disclosure. The steps of the method illustrated in FIG. 1 are individually illustrated in FIGS. 2A-2D, which are discussed in conjunction with FIG. 1 below. The process begins by providing a semiconductor substrate 200 including an inert material layer 202 and a semiconductor layer 204 on the inert material layer 202 (block 100 and FIG. 2A). The semiconductor substrate 200 may be a semiconductor wafer. The semiconductor layer 204 may comprise any semiconductor material system, but in particular may include indium (e.g., indium-arsenide, indium-antimonide, indium-phosphate, etc.), gallium (e.g., gallium-arsenide, gallium-antimonide, gallium-phosphate, gallium-nitride, etc.), aluminum, antimony, phosphorous, cadmium, mercury, tellurium, silicon germanium, lead bismuth, zinc, and the like. The inert material layer 202 may be titanium, tungsten, platinum, rhenium, tantalum, molybdenum, niobium, chromium, vanadium or any other suitable metal that is non-reactive with the semiconductor layer 204 as well as a bonding agent as discussed below. In one embodiment in which the semiconductor layer 204 is gallium-nitride used for optical purposes, an inert material layer 202 of tungsten silicide may be advantageous. The inert material layer 202 may comprise a non-metal layer in some embodiments. For example, the inert material layer 20 may comprise an oxide or a nitride such as silicon-dioxide, silicon-nitride, alumina, or the like.

Figure 2B:
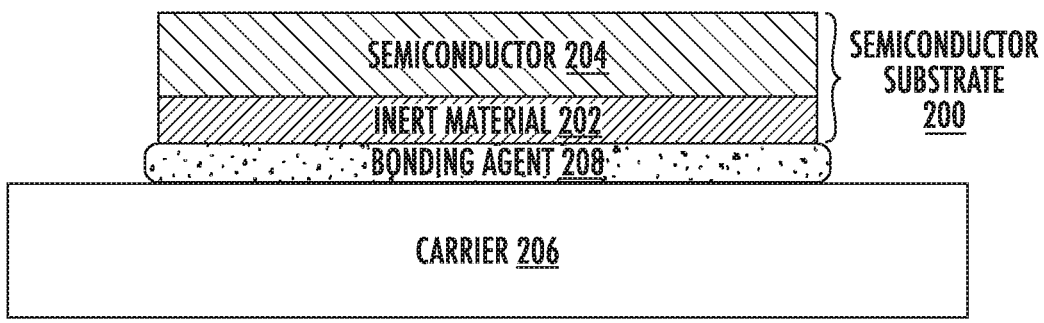

The semiconductor substrate 200 is bonded to a carrier 206 such that the inert material layer 202 is between the semiconductor substrate 200 and the carrier 206 (block 102 and FIG. 2B). As shown in FIG. 2B, a bonding agent 208 may be used to bond the semiconductor substrate 200 with the carrier 206. The bonding agent 208 may be a metal layer with a melting point that is below a melting point of the inert material layer 202, the semiconductor layer 204, and the carrier 206. For example, the bonding agent 208 may comprise gallium, indium, tin-lead, or any other suitable metal. Since the inert material layer 202 is between the bonding agent 208 and the semiconductor layer 204, interaction between the bonding agent 208 and the semiconductor layer 204 is significantly reduced or minimized. In other words, the inert material layer 202 prevents interaction between the semiconductor layer 204 and the bonding agent 208, such as diffusion, chemical interactions, and the like. For example, as discussed above, when the gallium bonding agent 208 is used with the semiconductor substrate 200 where the semiconductor layer 204 includes indium, the inert metal layer 202 will prevent the diffusion of the gallium bonding agent 208 into the indium semiconductor layer 204. Generally, the inert metal layer 202 is not suitable for bonding the semiconductor substrate 200 to the carrier 206

(e.g., due to a very high melting point), and therefore the bonding agent 208 is still required to bond the semiconductor substrate 200 to the carrier 206. The carrier 206 is provided to support and stabilize the semiconductor substrate 200. The carrier 206 generally has a high melting point and may comprise tantalum, molybdenum, or any other suitable material.

Figure 2C:
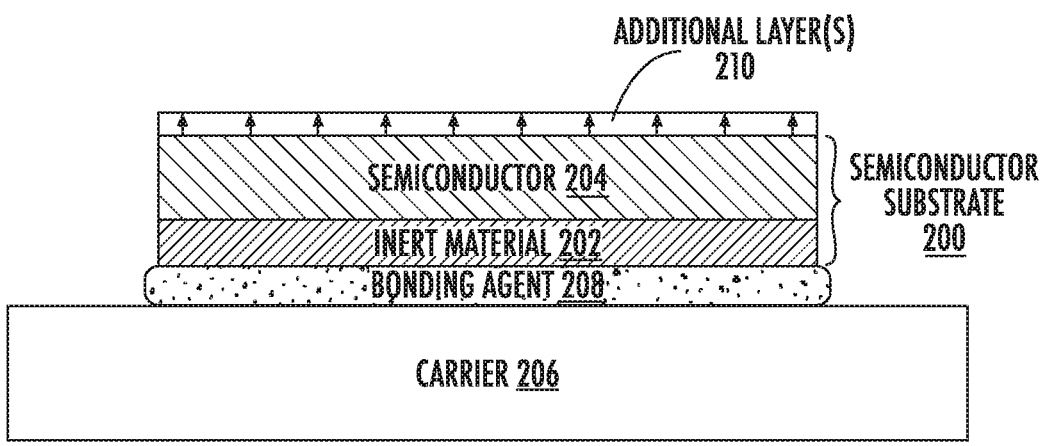

With the semiconductor substrate 200 supported and stabilized by the carrier 206, one or more additional layers 210 are provided on the semiconductor substrate 200 (block 104 and FIG. 2C). The one or more additional layers 210 may be epitaxially grown, for example, via an epitaxy process such as molecular beam epitaxy. In one embodiment, the one or more additional layers include one or more semiconductor devices on the semiconductor substrate 200 such that the one or more additional layers 210 include a device layer. The one or more semiconductor devices may be epitaxially grown, for example, via an epitaxy process such as molecular beam epitaxy. The semiconductor devices may be any type of semiconductor devices such as transistors, nanowires, and the like.

Figure 2D:
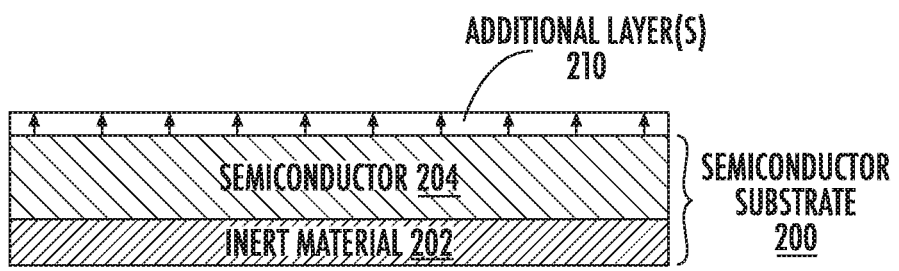

Once the one or more additional layers 210 are provided, the semiconductor substrate 200 is removed from the carrier 206 (block 106 and FIG. 2D). While not shown, additional semiconductor fabrication processes may be performed on the semiconductor substrate 200 such as implantation, metallization, dicing, etc. In general, however, the device shown in FIG. 2D is the result of the processes discussed herein. Due to the presence of the inert material layer 202, there is little to no interaction between the bonding agent 208 and the semiconductor layer 204. For example, when the gallium bonding agent 208 is used with the semiconductor substrate 200 wherein the semiconductor layer 204 includes indium, the inert metal layer 202 will prevent the diffusion of the gallium bonding agent 208 into the indium semiconductor layer 204. This prevents the formation of an indium-gallium layer that makes removal of the semiconductor substrate 200 from the carrier 206 difficult.

Figure 3:
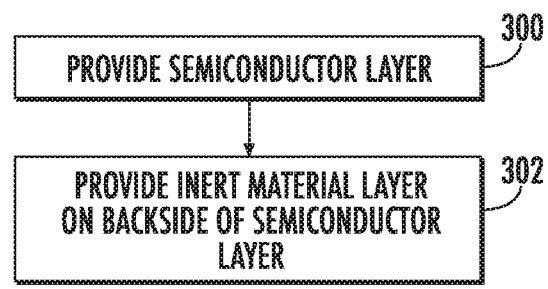
FIG. 3 is a flow diagram illustrating details of the method for fabricating one or more semiconductor devices of FIG. 1 according to one embodiment of the present disclosure.
Figure 4A:
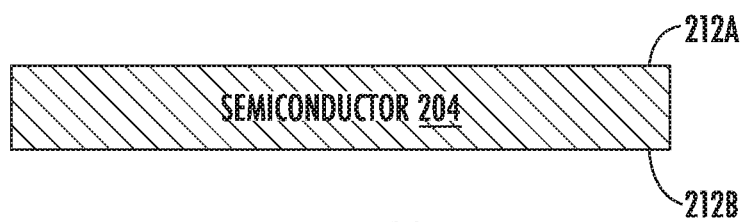
FIGS. 4A and 4B illustrate the details of the method for fabricating one or more semiconductor devices of FIG. 3 according to one embodiment of the present disclosure.

FIG. 3 is a flow diagram illustrating details of providing the semiconductor substrate 200 including the inert material layer 202 and the semiconductor layer 204 according to one embodiment of the present disclosure. The steps of the method illustrated in FIG. 3 are individually illustrated in FIGS. 4A and 4B, which are discussed in conjunction with FIG. 3 below. First, the semiconductor layer 204 is provided (block 300 and FIG. 4A). As discussed above, the semiconductor substrate 200 may be a semiconductor wafer. Processes for providing a semiconductor wafer are well known and thus not discussed herein, but at a high level may include growing a semiconductor crystal, cutting the semiconductor crystal, polishing the cut semiconductor crystal, and the like. The semiconductor layer 204 may thus represent a conventional semiconductor wafer. As shown in FIG. 4A, the semiconductor layer 204 includes a frontside 212A and a backside 212B. As discussed above, the semiconductor layer 204 may comprise indium, gallium, or the like.

Figure 4B:
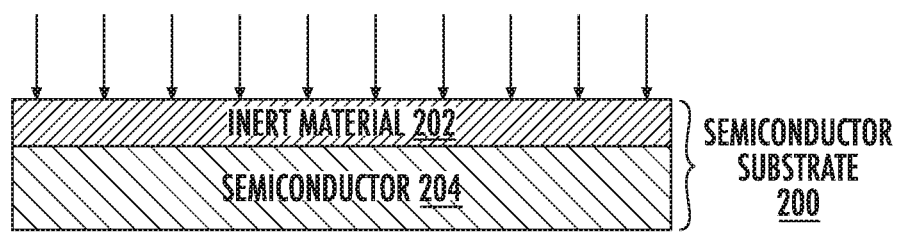

The inert material layer 202 is provided on the backside 212B of the semiconductor layer 204 (block 302 and FIG. 4B). In one embodiment, the inert material layer 202 is deposited on the backside 212B of the semiconductor layer 204 via a deposition process (e.g., chemical vapor deposition, sputtering, etc.) As discussed above, the inert material layer 202 may comprise titanium, tungsten, or the like.

Figure 5:
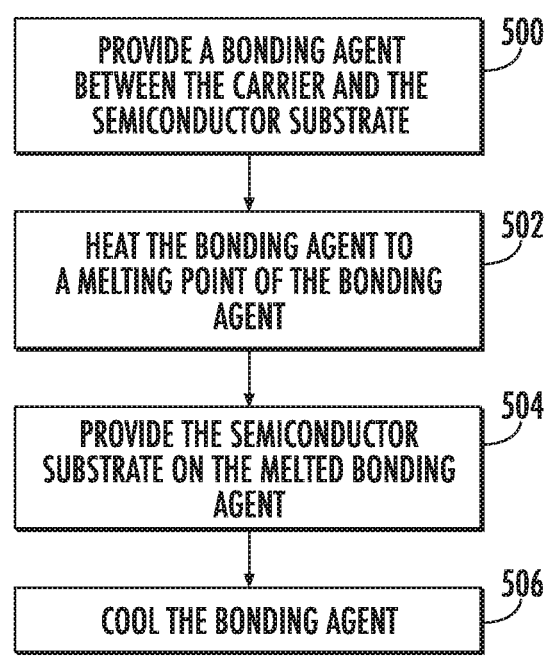
FIG. 5 is a flow diagram illustrating details of the method for fabricating one or more semiconductor devices of FIG. 1 according to one embodiment of the present disclosure.
Figure 6A:
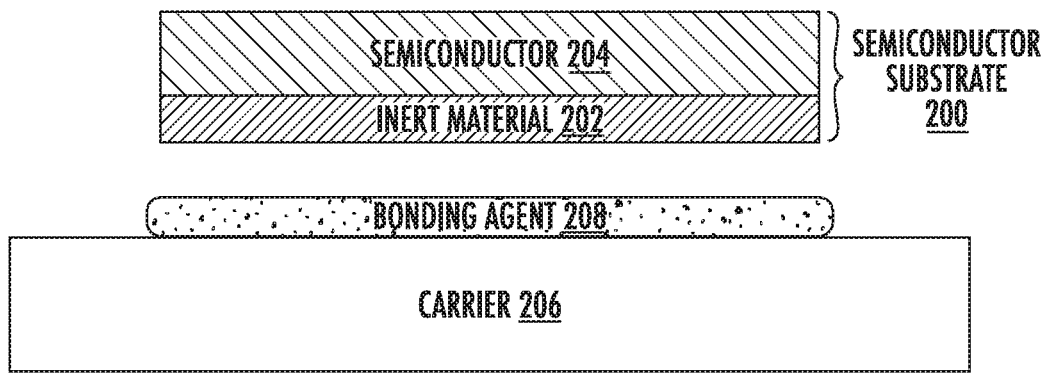
FIGS. 6A through 6D illustrate the details of the method for fabricating one or more semiconductor devices of FIG. 5 according to one embodiment of the present disclosure.

FIG. 5 is a flow diagram illustrating details of bonding the semiconductor substrate 200 to the carrier 206 according to one embodiment of the present disclosure. The steps of the method illustrated in FIG. 5 are individually illustrated in FIGS. 6A-6D, which are discussed in conjunction with FIG. 5 below. First, the bonding agent 208 is provided between the carrier 206 and the semiconductor substrate 200 (block 500 and FIG. 6A). As discussed above, the bonding agent 208 may be a metal with a low melting temperature such as gallium. In some embodiments, the bonding agent 208 is applied directly to the carrier 206 as shown in FIG. 6A. The bonding agent 208 may require heat to be spread onto the carrier 206 and thus, while not shown, heat may be applied to the carrier 206 in order to apply the bonding agent 208 thereto.

Figure 6B:
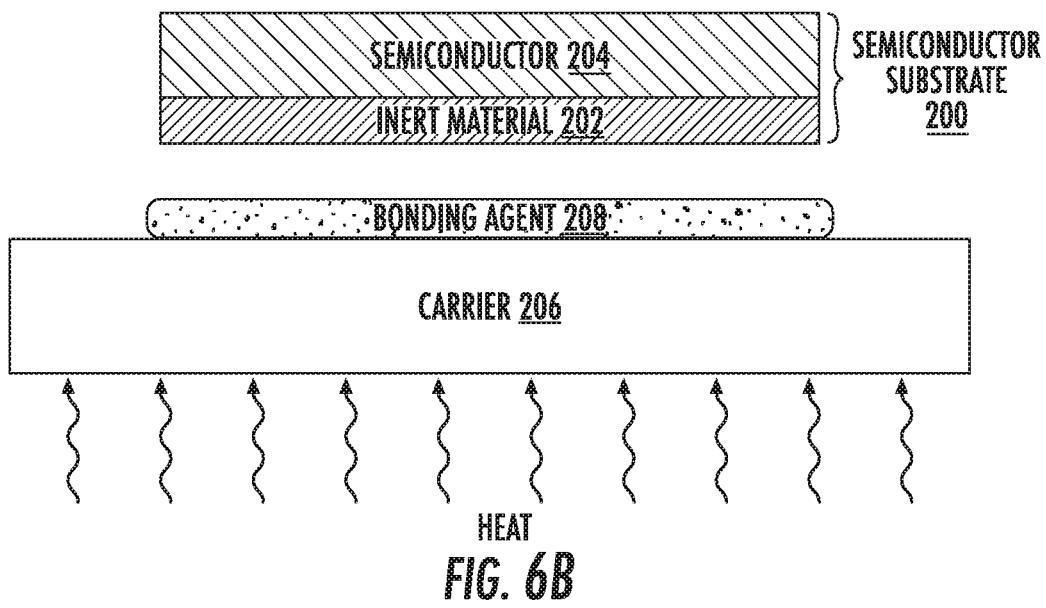
Figure 6C:
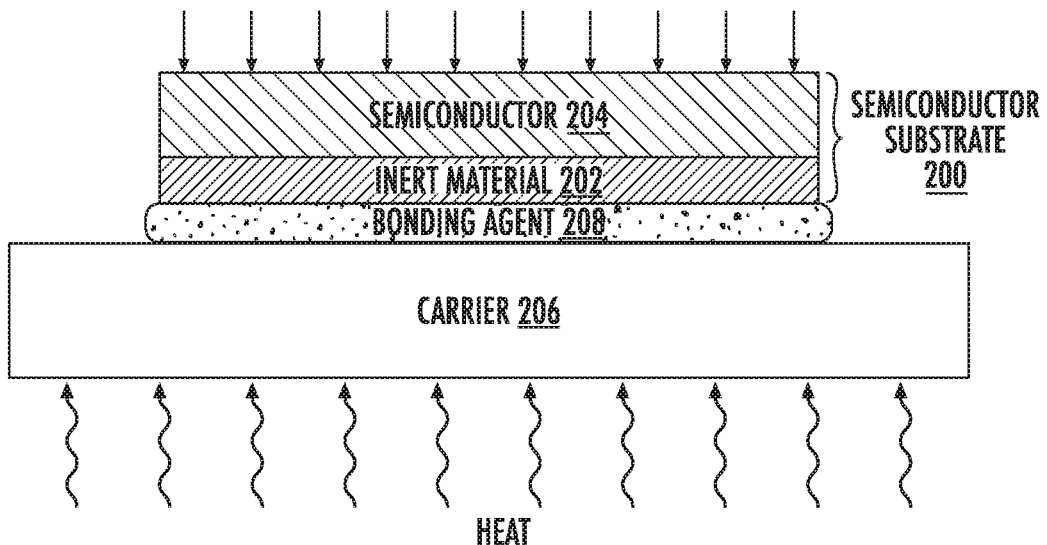
Figure 6D:
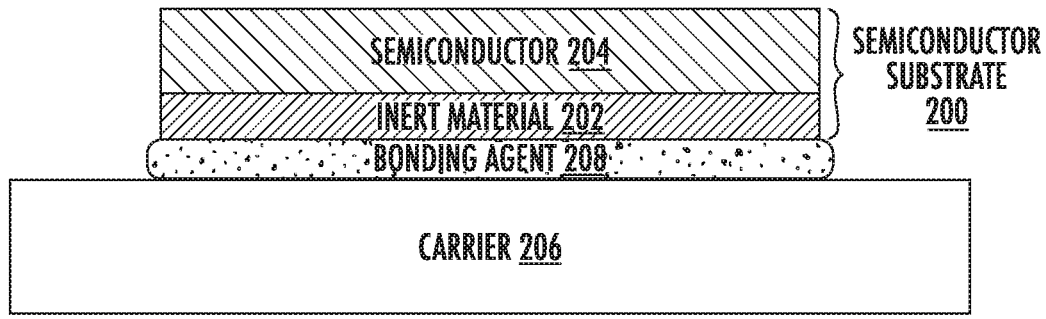

The bonding agent 208 is then heated to a melting point of the bonding agent (block 502 and FIG. 6B). In one embodiment, heating the bonding agent 208 to the melting point thereof may include providing the carrier 206 on a hot plate such that the bonding agent 208 is heated through the carrier 206. However, any suitable process may be used to heat the bonding agent 208. As discussed above, the bonding agent 208 may be simultaneously heated and provided in some embodiments such that blocks 500 and 502 occur simultaneously. Further as discussed above, a melting point of the bonding agent 208 is lower than a melting point of the inert material layer 202 and the semiconductor layer 204. Accordingly, heating the bonding agent 208 to the melting point thereof as is necessary to bond the semiconductor substrate 200 to the carrier 206 does not negatively affect the inert material layer 202 or the semiconductor layer 204. The semiconductor substrate 200 is provided on the melted bonding agent 208 (block 504 and FIG. 6C), and the bonding agent 208 is optionally cooled (block 506 and FIG. 6D).

Figure 7:
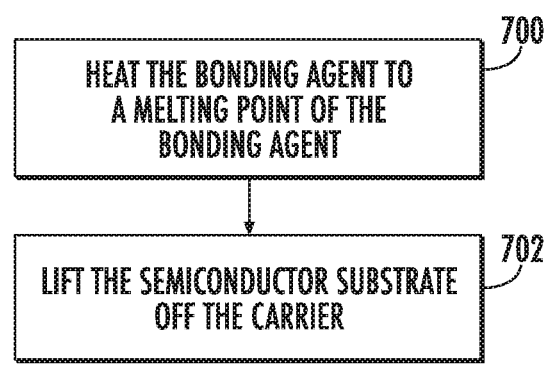
FIG. 7 is a flow diagram illustrating details of the method for fabricating one or more semiconductor devices of FIG. 1 according to one embodiment of the present disclosure.
Figure 8A:
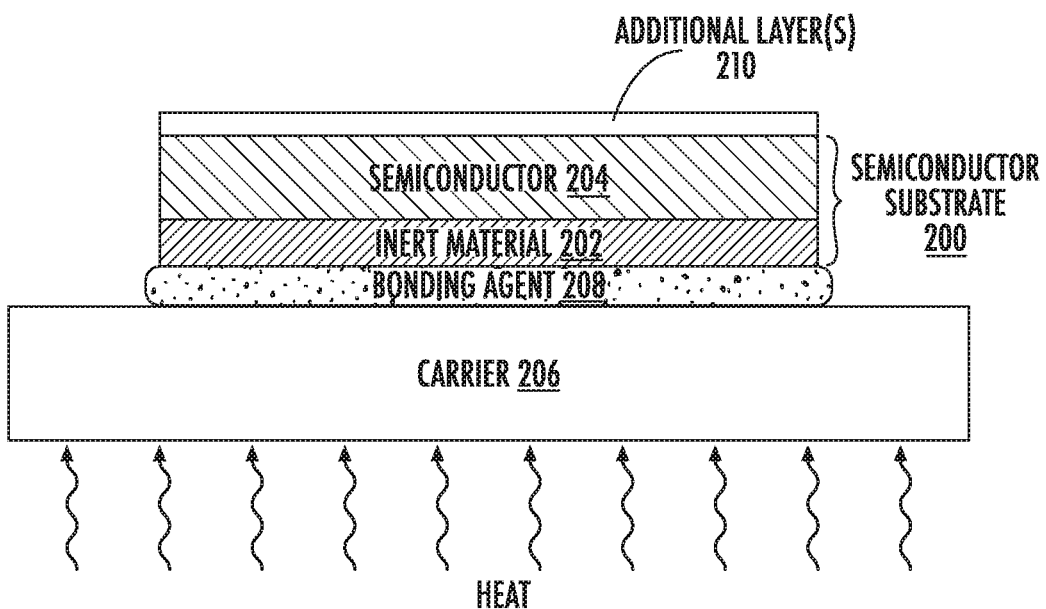
FIGS. 8A and 8B illustrate the details of the method for fabricating one or more semiconductor devices of FIG. 7 according to one embodiment of the present disclosure.

FIG. 7 is a flow diagram illustrating details of removing the semiconductor substrate 200 from the carrier 206 according to one embodiment of the present disclosure. The steps of the method illustrated in FIG. 7 are illustrated individually in FIGS. 8A and 8B, which are discussed in conjunction with FIG. 7 below. First, the bonding agent 208 is heated to a melting point thereof (block 700 and FIG. 8A). As discussed above, this may be accomplished by providing the carrier 206 on a hot plate and heating the bonding agent 208 through the carrier 206. However, any suitable method may be used for heating the bonding agent 208. Further as discussed above, the melting point of the bonding agent 208 is lower than the melting point of the inert material layer 202 and the semiconductor layer 204 such that heating the bonding agent 208 to the melting point thereof as is necessary for removal of the semiconductor substrate 200 from the carrier 206 does not negatively affect the inert material layer 202 or the semiconductor layer 204.

Figure 8B:
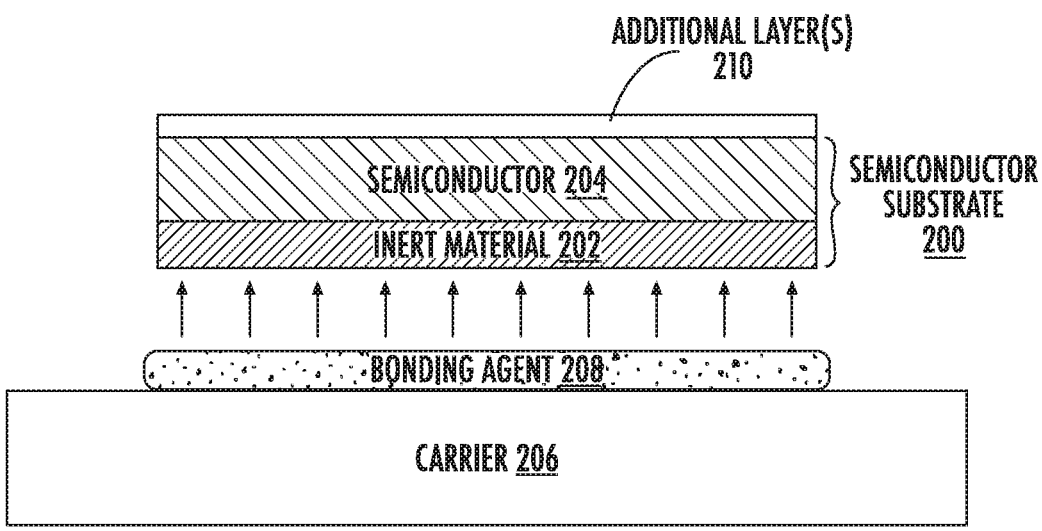

The semiconductor substrate 200 is then lifted off of the carrier 206 (block 702 and FIG. 8B). The inert material layer 202 remains on the semiconductor layer 204. Further, some of the bonding agent 208 may remain on the inert material layer 202. While not shown, the inert material layer 202 (and/or any remaining portion of the bonding agent 208) may optionally be removed from the semiconductor substrate 200, for example, via a grinding process.

The above examples show a process in which the inert material layer 202 provides a barrier between the semiconductor layer 204 and the bonding agent 208 so that the semiconductor substrate 200 can be easily bonded to and removed from the carrier 206. The bonding agent 208 ensures a strong connection between the semiconductor substrate 200 and the carrier 206 and thus allows for the carrier 206 to support and stabilize the semiconductor substrate 200 during one or more semiconductor fabrication processes. Due to the precision required for advanced semiconductor fabrication processes, said support and stabilization is essential to the creation of the semiconductor devices. Accordingly, the principles of the present disclosure allow for the fabrication of very precise semiconductor devices using advanced techniques (e.g., in-situ processes such as molecular beam epitaxy).

Those skilled in the art will recognize improvements and modifications to the preferred embodiments of the present disclosure. All such improvements and modifications are considered within the scope of the concepts disclosed herein and the claims that follow.

What is claimed is:

1. A method for fabricating a semiconductor device comprising:
   providing a semiconductor substrate comprising an inert material layer and a semiconductor layer on the inert material layer, wherein:
      the semiconductor layer comprises at least one of indium-arsenide, indium-antimonide, indium-phosphate, gallium-arsenide, gallium-antimonide, gallium-phosphate, aluminum, antimony, phosphorus, cadmium, mercury, tellurium, silicon germanium, lead bismuth, and zinc; and
      the inert material layer comprises at least one of titanium, tungsten, platinum, rhenium, tantalum, molybdenum, niobium, chromium, and vanadium; and
   bonding the semiconductor substrate to a carrier such that the inert material layer is between the carrier and the semiconductor layer, wherein the carrier comprises at least one of tantalum and molybdenum.

2. The method of claim 1 wherein the inert material layer is directly on the semiconductor layer.

3. The method of claim 1 further comprising, after bonding the semiconductor substrate to the carrier, providing one or more additional layers on the semiconductor substrate.

4. The method of claim 3 wherein the one or more additional layers are provided via a molecular beam epitaxy process.

5. The method of claim 3 further comprising, after the one or more additional layers are provided on the semiconductor substrate, removing the semiconductor substrate from the carrier.

6. The method of claim 5 wherein bonding the semiconductor substrate to the carrier comprises:
   providing a bonding agent between the carrier and the semiconductor substrate;
   heating the bonding agent to a melting point of the bonding agent;
   providing the semiconductor substrate on the melted bonding agent; and
   allowing the bonding agent to cool.

7. The method of claim 6 wherein removing the semiconductor substrate from the carrier comprises:
   heating the bonding agent to the melting point of the bonding agent; and
   lifting the semiconductor substrate off of the carrier.

8. The method of claim 6 wherein the bonding agent is a metal.

9. The method of claim 8 wherein the melting point of the bonding agent is lower than a melting point of the inert material layer and the semiconductor layer.

10. The method of claim 6 wherein the bonding agent comprises one of gallium and indium.

11. The method of claim 1 wherein the semiconductor layer comprises at least one of indium-arsenide, indium-antimonide, gallium-arsenide, and gallium-antimonide.

12. A method for fabricating a semiconductor device comprising:
    providing a semiconductor substrate comprising an inert material layer and a semiconductor layer on the inert material layer; and
    bonding the semiconductor substrate to a carrier comprising:
       providing a bonding agent between the carrier and the semiconductor substrate, such that the inert material layer of the semiconductor substrate is between the bonding agent and the semiconductor layer of the semiconductor substrate, wherein the bonding agent comprises gallium;
       melting the bonding agent;
       providing the semiconductor substrate on the melted bonding agent; and
       allowing the bonding agent to cool.

13. The method of claim 12 wherein the bonding agent has a melting point that is lower than a melting point of the inert material layer and the semiconductor layer.

14. The method of claim 12 wherein:
    the inert material layer comprises at least one of titanium, tungsten, platinum, rhenium, tantalum, molybdenum, niobium, chromium, and vanadium; and
    the semiconductor layer comprises at least one of gallium, aluminum, antimony, phosphorus, cadmium, mercury, tellurium, silicon germanium, lead bismuth, zinc, and indium.

15. The method of claim 12 wherein the inert material layer prevents diffusion of the bonding agent into the semiconductor layer.

16. The method of claim 12 further comprising, after bonding the semiconductor substrate to the carrier, providing one or more additional layers on the semiconductor substrate via a molecular beam epitaxy process.

17. The method of claim 16 further comprising, after the one or more additional layers are provided on the semiconductor substrate:
    heating the bonding agent to the melting point of the bonding agent; and
    lifting the semiconductor substrate off of the carrier.

18. The method of claim 12 wherein the carrier comprises tantalum or molybdenum.

19. The method of claim 14 wherein the semiconductor layer comprises at least one of indium-arsenide, indium-antimonide, gallium-arsenide, and gallium-antimonide.

* * * * *